(12) United States Patent
Nagamatsu et al.

(10) Patent No.: US 9,035,454 B2
(45) Date of Patent: May 19, 2015

(54) ELEMENT MOUNTING BOARD AND SEMICONDUCTOR MODULE

(71) Applicant: SANYO ELECTRIC CO., LTD., Moriguchi-shi Osaka (JP)

(72) Inventors: Masayuki Nagamatsu, Gifu (JP); Mayumi Nakasato, Gifu (JP); Masurao Yoshii, Tochigi (JP); Yasuhiro Kohara, Osaka (JP); Kotaro Deguchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/092,320

(22) Filed: Nov. 27, 2013

(65) Prior Publication Data

US 2014/0084452 A1  Mar. 27, 2014

Related U.S. Application Data

(63) Continuation of application No. PCT/JP2012/004810, filed on Jul. 27, 2012.

(30) Foreign Application Priority Data

Jul. 29, 2011 (JP) .................................. 2011-167415
Aug. 31, 2011 (JP) .................................. 2011-190092

(51) Int. Cl.
| | |
|---|---|
| *H01L 23/48* | (2006.01) |
| *H01L 23/52* | (2006.01) |
| *H01L 29/40* | (2006.01) |
| *H05K 1/05* | (2006.01) |
| *H01L 23/373* | (2006.01) |

(Continued)

(52) U.S. Cl.
CPC ............... *H01L 23/48* (2013.01); *H05K 1/053* (2013.01); *H05K 1/056* (2013.01); *H05K 3/0052* (2013.01); *H05K 2201/0191* (2013.01); *H05K 2201/0195* (2013.01); *H05K 2201/09145* (2013.01); *H05K 2203/049* (2013.01); *H01L 23/3735* (2013.01); *H01L 23/49811* (2013.01); *H01L 21/561* (2013.01); *H01L 2224/32225* (2013.01); *H01L 2224/48091* (2013.01); *H01L 2224/48227* (2013.01); *H01L 2224/73265* (2013.01); *H01L 23/3121* (2013.01); *H01L 21/565* (2013.01); *H01L 2224/45124* (2013.01); *H01L 2924/13091* (2013.01); *H01L 2924/13055* (2013.01)

(58) Field of Classification Search
CPC ... H01L 23/48; H01L 23/3121; H01L 21/565; H01L 21/561; H01L 23/3735; H05K 1/056; H05K 1/053
See application file for complete search history.

(56) References Cited

U.S. PATENT DOCUMENTS

| | | | | |
|---|---|---|---|---|
| 4,711,822 | A * | 12/1987 | Choyke et al. | ................. 428/458 |
| 8,368,291 | B2 * | 2/2013 | Seo et al. | ......................... 313/45 |

(Continued)

FOREIGN PATENT DOCUMENTS

| | | |
|---|---|---|
| JP | 58-132990 A | 8/1983 |
| JP | 62-188345 A | 8/1987 |

(Continued)

OTHER PUBLICATIONS

International Search Report issued in International Application No. PCT/JP2012/004810 dated Aug. 28, 2012.

*Primary Examiner* — William D Coleman
(74) *Attorney, Agent, or Firm* — McDermott Will & Emery LLP

(57) ABSTRACT

Prepared in advance is a substrate formed of metallic material where slits are formed between mounting regions. Oxide films are generated all over the substrate including end faces of the substrate. Exposed are only lateral faces corresponding to the cross sections cut when tie bars are cut. This structure and the fabrication method minimize the area of cutting faces in the metallic material.

13 Claims, 15 Drawing Sheets

(51) Int. Cl.
      *H01L 21/56* (2006.01)
      *H01L 23/31* (2006.01)
      *H05K 3/00* (2006.01)
      *H01L 23/498* (2006.01)

(56) References Cited

U.S. PATENT DOCUMENTS

| | | |
|---|---|---|
| 2007/0164766 A1 | 7/2007 | Murai et al. |
| 2008/0247131 A1* | 10/2008 | Hitomi et al. ............ 361/685 |
| 2014/0078687 A1* | 3/2014 | Kohara et al. ............ 361/746 |

FOREIGN PATENT DOCUMENTS

| | | |
|---|---|---|
| JP | 63-070489 A | 3/1988 |
| JP | 2-066182 A | 3/1990 |
| JP | 4-071284 A | 3/1992 |
| JP | 5-211335 A | 8/1993 |
| JP | 7-142861 A | 6/1995 |
| JP | 8-130289 A | 5/1996 |
| JP | 2003-017629 A | 1/2003 |
| JP | 2007-088365 A | 4/2007 |
| JP | 2007-249329 A | 9/2007 |

* cited by examiner

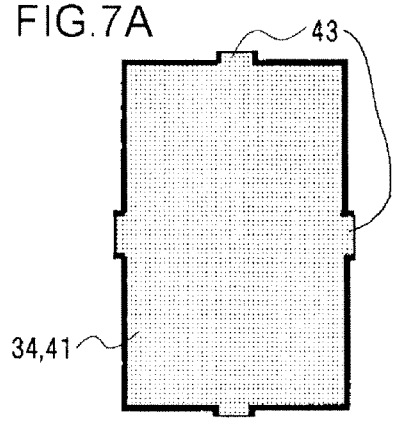
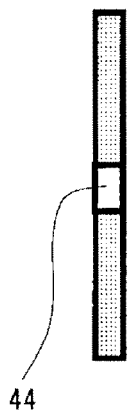
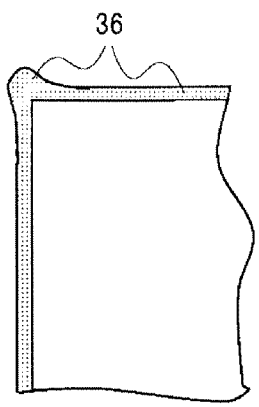
FIG.7A
FIG.7C
FIG.7D
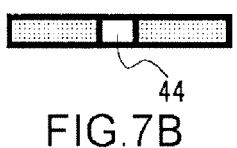
FIG.7B
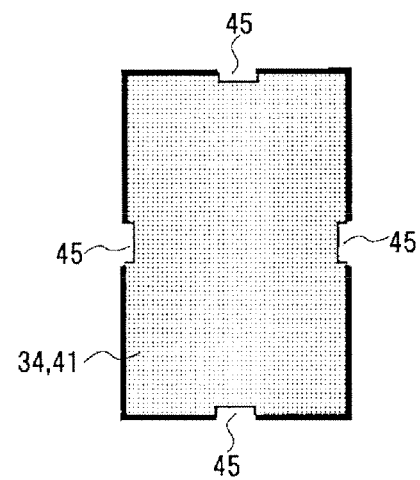
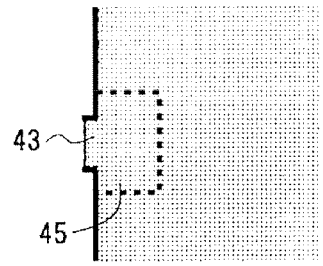
FIG.7E
FIG.7F
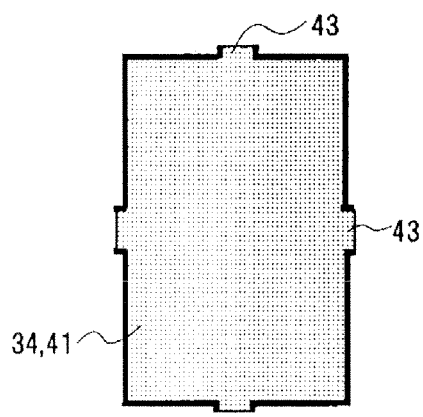
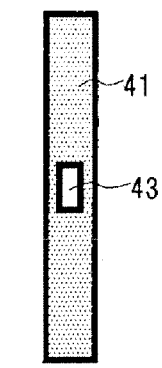
FIG.7G
FIG.7H

ELEMENT MOUNTING BOARD AND SEMICONDUCTOR MODULE

RELATED APPLICATIONS

This application is a continuation of International Application No. PCT/JP2012/004810, filed on Jul. 27, 2012, which in turn claims the benefit of Japanese Application Nos. 2011-167415, filed on Jul. 29, 2011 and 2011-190092, filed on Aug. 31, 2011, the disclosures of which Applications are incorporated by reference herein.

BACKGROUND OF THE INVENTION

1. Field of the Invention

The present disclosure relates to a high breakdown-voltage element mounting board formed mainly of a metal, a semiconductor module using the element mounting board, and a method for fabricating the element mounting board and the semiconductor module.

2. Description of the Related Art

In recent years, the reduction of environmental load is often discussed in the press, and many corporations are doing their researches on the reduction of energy in particular and on highly efficiency semiconductor modules from various angles.

Among those semiconductor modules and semiconductor elements, a semiconductor element for use in a high power application is particularly used to drive the motor of a refrigerator, a washing machine, an air conditioner or the like used at home. The power consumed by these home electric appliances is a factor not to be missed if the power consumed thereby is summed on a global scale. Accordingly, the recent development to achieve the energy saving in various aspects involves, for example, the reduction of standby power, the use of LED lighting, the inverter control in each home electronic appliance.

An important factor not to be missed in the reduction of power is the heat radiation. In other words, semiconductor elements generate heat when they are driven. If such heat is not sufficiently radiated from the semiconductor elements, the semiconductor elements will suffer a high temperature and cannot enhance the drive current, resulting in a large power loss. In order to improve the heat radiation, every effort is made to raise the heat release property by using a copper (Cu) frame, a metallic substrate and additionally a large heat radiation fin, for instance.

In the conventional practice, a semiconductor module including a metallic substrate in an element mounting board is constructed as follows. That is, an anodic oxide film is formed on the surface of an aluminum substrate, for instance, and a wiring and a semiconductor element are mounted on this anodic oxide film with an insulating resin layer disposed between the anodic oxide film and the semiconductor element. In the conventional method for fabricating a semiconductor module, the anodic oxide film is formed on the surface of a large-sized substrate through anodic oxidation, and a wiring pattern is formed on the anodic oxide film via the insulating resin layer. After this, the semiconductor element is mounted thereon and then the large-sized substrate (substrate sheet) is separated into individual pieces.

RELATED ART LIST (1) Japanese Patent Application Publication No. Hei08-130289.

(2) Japanese Patent Application Publication No. Sho58-132990.

(3) Japanese Patent Application Publication No. Hei05-211335.

(4) Japanese Patent Application Publication No. 2007-249329.

(5) Japanese Patent Application Publication No. Hei07-142861.

In the element mounting board having a metallic substrate, which has been manufactured using the conventional fabrication process or in the semiconductor module including this element mounting board, the structure is such that entire end faces of the metallic substrate are exposed. Also, there is a likelihood of cracking in the anodic oxide film when the metallic substrate is cut into pieces. Now, suppose that, in this manner, the entire end faces of a metallic sheet are exposed, and a high voltage is applied to the semiconductor module while the anodic oxide film suffers cracks. Then, a circuit formed in the semiconductor module and the casing of equipment or the like may possibly be short-circuited.

SUMMARY OF THE INVENTION

The present disclosure has been made in view of the foregoing circumstances, and one non-limiting and exemplary embodiment provides a technology capable of improving the breakdown voltage of an element mounting board.

One embodiment of the present invention relates to an element mounting board. The element mounting board includes: a metallic substrate formed of metallic material; an insulating layer provided on the metallic substrate; and a pattern formed of a metal provided on the insulating layer, wherein oxide films generated from the metallic material are provided in a surface of the metallic substrate, a reverse side disposed counter to the surface of the metallic surface, a surrounding lateral face connecting the surface of the metallic substrate and the reverse side thereof, and the lateral face, on which the oxide film has generated, has an exposed portion where a partial surface of the metallic material is exposed.

Additional benefits and advantages of the disclosed embodiments will be apparent from the specification and Figures. The benefits and/or advantages may be individually provided by the various embodiments and features of the specification and drawings, and need not all be provided in order to obtain one or more of the same.

These general and specific aspects may be implemented using a system, a method, and a computer program, and any combination of systems, methods, and computer programs.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIGS. 7A to 7H are diagrams to explain a method for fabricating a semiconductor module according to a first embodiment;

DETAILED DESCRIPTION

The present disclosure will now be described by reference to the exemplary embodiments. This does not intend to limit the scope of the present disclosure, but to exemplify the disclosure.

Figure 9:
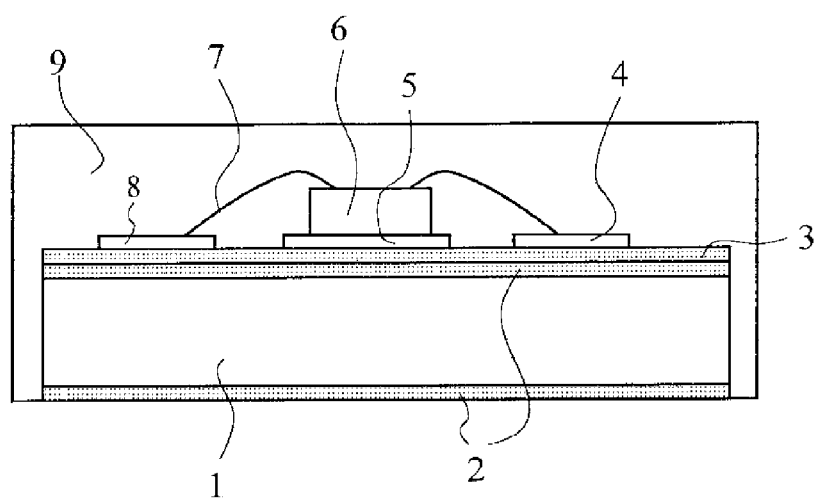
FIG. 9 is a diagram to explain a conventional semiconductor module.
Figure 10A:
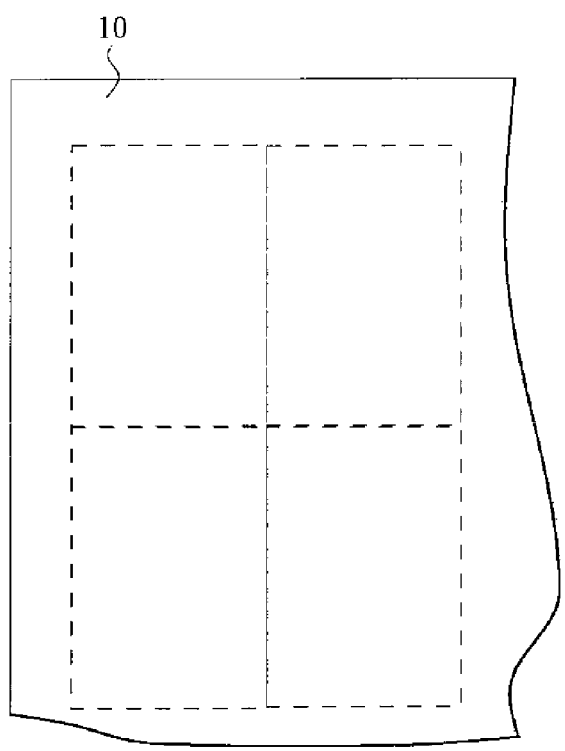
FIGS. 10A and 10B are diagrams to explain a conventional method for fabricating a semiconductor module.
Figure 10B:
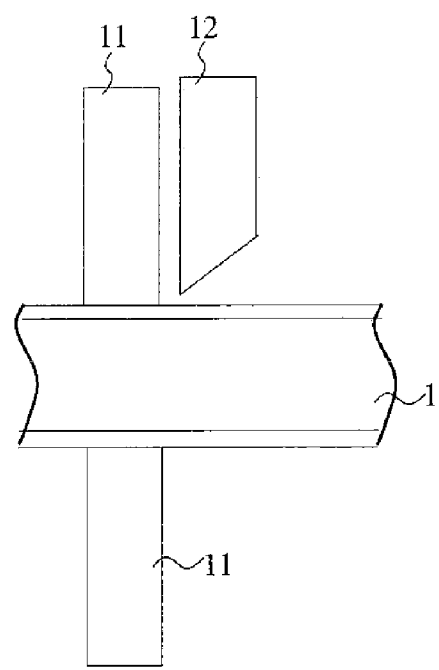

Hereinafter, the exemplary embodiments of the present disclosure or the present invention, will be described based on the accompanying drawings. The same or equivalent constituents, members, or processes illustrated in each drawing will be denoted with the same reference numerals, and the repeated descriptions thereof will be omitted as appropriate. The exemplary embodiments do not intend to limit the scope of the invention but exemplify the invention. All of the features and the combinations thereof described in the embodiments are not necessarily essential to the invention A description is first given of a conventionally known technique. FIG. 9 is a diagram to explain semiconductor module using a general metallic substrate. FIGS. 10A and 10B are diagrams to explain a method for separating a substrate into individual semiconductor modules as shown in FIG. 9. A Cu substrate or an Al substrate is used; particularly in terms of the weight and cost, a semiconductor element using the Al substrate or a hybrid integrated circuit (IC) has been the focus of attention in recent years.

A substrate 1 is formed mainly of Al, and an anodic oxide film 2 is formed on the Al substrate 1. Further, a Cu pattern 4 is formed on the anodic oxide film 2 with an insulating resin layer 3 held between the anodic oxide film 2 and the Cu pattern 4. A pattern includes an island 5, an electrode 8, a wiring 4, and so forth. In FIG. 9, a semiconductor element 6 is firmly fixed on top of the island 5, and the semiconductor element 6 and the electrode 8 are connected to each other using a thin metallic wire 7.

Also, a semiconductor module shown in FIG. 9 is sealed with a resin 9. This sealing method may be a potting method or a method using a casing; recently, it is popular to use a transfer-mold method for the sealing.

A description is given hereunder of the outline of a method for fabricating the semiconductor module shown in FIG. 9.

A large-sized Al substrate 1, which corresponds to the reference numeral 10 in FIG. 10A, is first prepared and a Cu sheet is attached to the Al substrate 1 with the anodic oxide film 2 and the insulating resin layer 3 held between the Al substrate 1 and the Cu sheet. The Cu sheet is patterned by subjecting it to a general exposure/development process so as to form the Cu pattern 4 and the island 5. The semiconductor element 6 is mounted on the island 5 and is electrically connected to the electrode 8 using the thin metallic wire 7. Then, the substrate 1 that mounts the components thereon undergoes a mechanical cut-off using a press machine and is separated into individual pieces. At this time, lateral faces of the Al substrate 1 are exposed.

Then a description is given of a process for separating a substrate sheet into individual pieces, with reference to FIGS. 10A and 10B. FIG. 10A shows the large-sized Al substrate 10. The large-sized Al substrate 10 is diced into individual pieces or elements along the dotted lines shown in FIG. 10A. More specifically, the large-sized Al substrate 10 is cut into four pieces indicated by four rectangles in FIG. 10A cut along the dotted lines. FIG. 10B shows a cross section in a cutting process. The Al substrate 10 is position-fixed from above and below by a pressing means 11, and is diced in such a manner that a pressing blade 12 exerts pressure on the Al substrate 10 from above or below.

In the semiconductor module manufactured in this manner, however, the pressing means 11 applies much pressure around the Al substrate 10 and, furthermore, the pressing blade 12 applies the impact around the Al substrate 10. As a result, cracking occurs in a portion pressed by the pressing means 11 and in the anodic oxide film 2 pressed by the pressing blade 12.

Where aluminum is exposed on end faces of the substrate and the anodic oxide film suffers cracks, the following problem to be solved arises. That is, the problem is that when a high voltage is applied at the startup of the semiconductor module, a circuit formed in the semiconductor module and the casing of equipment or the like may possibly be short-circuited via an exposed end face of aluminum and/or an anodic oxide film having cracks.

This is attributable to the following facts. The adhesion of aluminum itself to the sealing resin 9 is poor and therefore moisture infiltrates through the spacing between aluminum and the sealing resin 9. Thus the cracks, which have occurred in the oxide film, serve as passages of moisture, thereby causing the degradation of breakdown strength. In particular, corners of the metallic substrate are subjected to the impact twice. That is, a pressure is applied in a vertical direction and another pressure is applied in a lateral direction. Further, the electric field concentration is more likely to occur in the corners thereof and thus attentions must be particularly directed to this problem.

The present disclosure will now be explained based on exemplary embodiments. A semiconductor module according to the exemplary embodiments can be used for a semiconductor device, where semiconductor elements only are mounted on a metallic substrate, and a hybrid IC device, where semiconductor elements and passive elements are arranged. Also, the semiconductor module according to the exemplary embodiments can be used for a light-emitting device or illuminating device, where LEDs are mounted, and a power module, which is an inverter module where a power element is mounted.

First Embodiment

A description is given of a hybrid IC device, which uses a metallic substrate formed of metallic material, as an exemplary semiconductor module.

In a first embodiment, insulating films are provided on lateral faces of a single piece of the metallic substrate, which is one of separated pieces. If, for example, the substrate is an aluminum (Al) substrate, Al oxide films are provided. In the first embodiment, measures are taken to prevent the cracking from occurring in an oxide film around the surface of a single piece of the metallic substrate. By employing such a structure as described above, a higher breakdown voltage can be attained and a semiconductor module having such a higher breakdown voltage can be achieved.

A description is first given of a fabrication method followed by a description of its structure.

<A Method for Fabricating a Semiconductor Module>

FIG. 1A is a plane view of an element mounting board 30, and FIG. 1B is a cross-sectional view of the element mounting board 30 taken along the line A-A of FIG. 1A. Also, each of FIGS. 2A, 3A, 4A and 5A is a plane view of the element mounting board 30, and each of FIGS. 2B, 3B, 4B and 5B is a cross-sectional view of the element mounting board 30.

A description is first given of a "process of preparing an element mounting board" with reference to FIGS. 1A and 1B. The element mounting board 30 is formed of metallic material. Here, the metallic material is one for which an insulating film is to be produced on its surface. The insulating film formed on the surface of the metallic film may be an oxide, for instance.

An oxide film produced from the metallic material is an insulating material, which is therefore effective in terms of the breakdown strength. The metallic material that is readily available includes Cu, a metallic material formed mainly of Cu, Al, a metallic material formed mainly of Al, and the like. Other metals may also be used instead.

In particular, Al is light-weight, and an oxide film easily grows on Al. Thus, a description is given hereunder of a case where Al is used or Al is used as a main constituent material.

Figure 1:
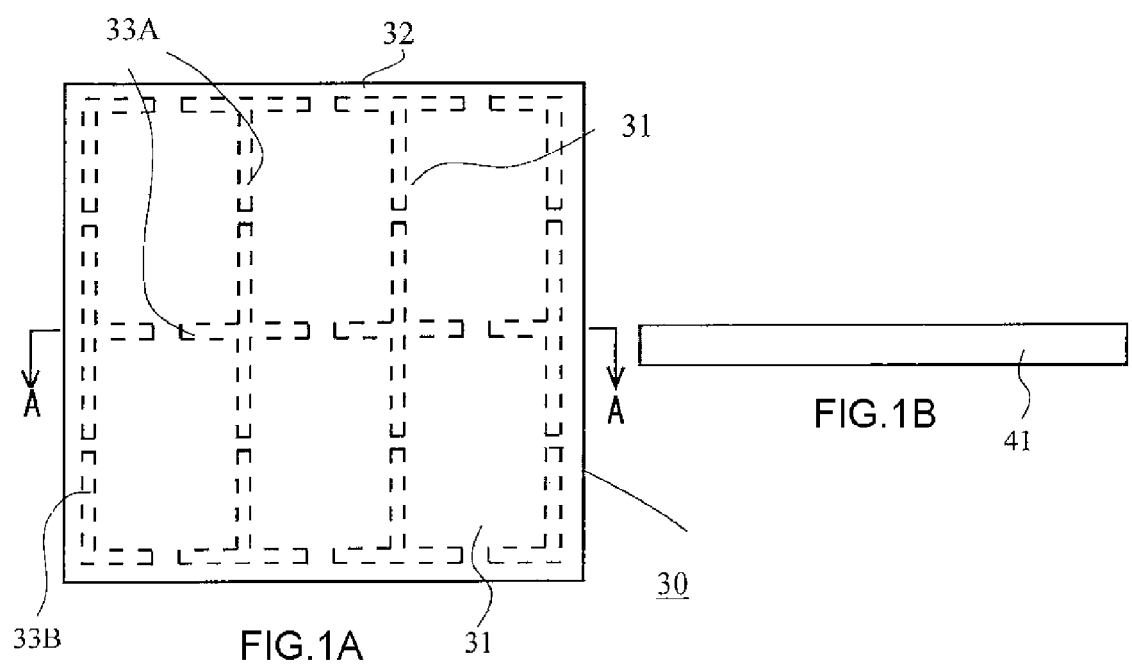
FIGS. 1A and 1B are diagrams to explain a method for fabricating a semiconductor module according to a first embodiment.

The element mounting board 30 shown in FIG. 1A is a substrate before the surface thereof is subjected to an oxidation treatment and is a so-called large-sized substrate. The rectangular regions indicated with dotted lines in FIG. 1 are regions that become mounting regions 34 later, and each of these regions is a single unit 31 used as a semiconductor module. In FIG. 1A, the six units 31 are arranged in three rows and two columns and are therefore arranged in a so-called matrix. A frame 32 is provided on the periphery of the units 31, which are arranged in a matrix containing at least two regions. A first slit forming region 33A is provided between mutually adjacent units 31, and a second slit forming region 33B is provided between the units 31, which are arranged in a matrix, and the frame 32.

Figure 2:
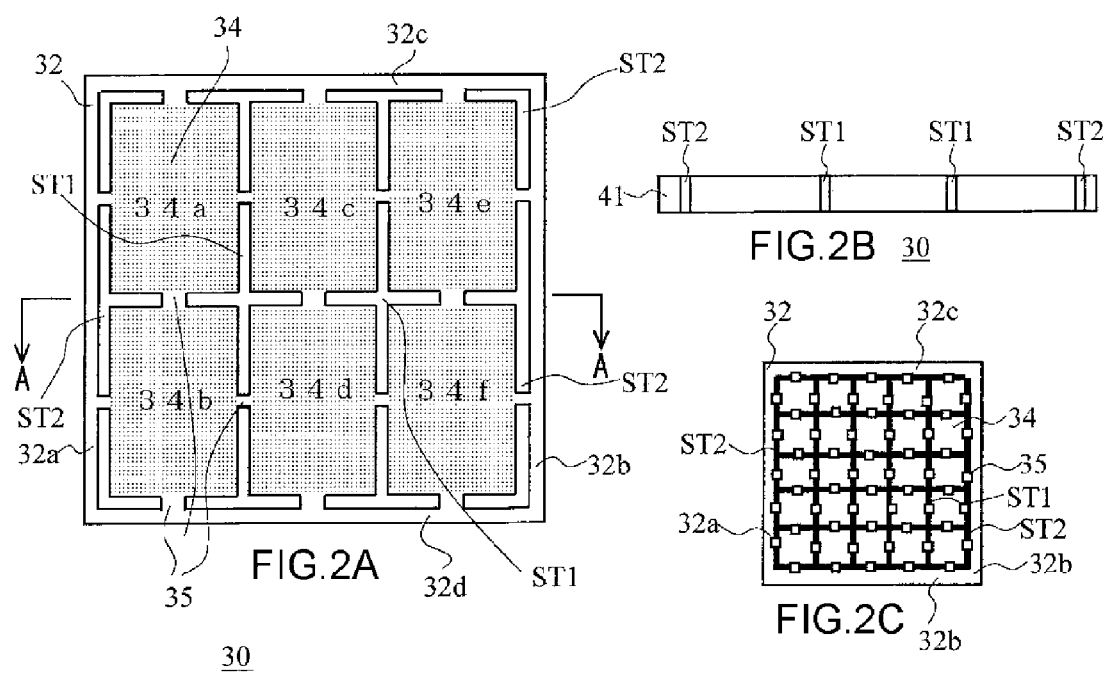
FIGS. 2A and 2C are diagrams to explain a method for fabricating a semiconductor module according to a first embodiment.

Then, the slit forming regions 33A and 33B are processed using a mechanical method, a chemical method or a thermal method so as to form slits ST1 and ST2 as shown in FIGS. 2A to 2C.

In the chemical method, the substrate is chemically etched using a chemical. In the thermal method, slit portions may be extracted using laser. In the mechanical method, the slits may be formed by dicing or by use of a router or drill. In the present embodiment, the slit forming regions 33A and 33B are processed by punching, as a mechanical method, which is simple in processes.

In the conventional example described earlier, the punching is performed after the formation of oxide film and therefore the cracking occurs in the oxide film. In contrast thereto, in the present embodiment, the Al substrate undergoes the punching before the oxide film is formed and therefore the cracking, which may otherwise be caused in this process, does not occur in the oxide film. As will be described in a later process, there is a possibility that the cracking will occur in the oxide film when tie bars 35 are cut. However, there is no need to take this into consideration because a region where the tie bar 35 is formed is an extremely narrow portion. Also, the direction in which the punching is performed may be from above or below the substrate. Note that, relative to this punching direction, a rounded part, which has a curved surface thereon and is of a shape having no sharp edges or corners, is formed in a corner in a frontal surface and burrs (e.g., on a machined edge) may occur in the frontal surface. Thus, the punching is performed through a surface opposite to the component side. On the other hand, the punching may be performed through the component side if the burrs are to be removed by flattening them by applying a pressure from above and/or by polishing them.

Next, a description is given of a planar shape of the element mounting board 30. The shape of the unit 31 may be arbitrary, and a description will be given herein assuming that the shape thereof is rectangular. For purposes of explanation, this single unit 31 is defined anew as the mounting region 34. In FIG. 2A, the mounting regions 34 are indicated by hatching through points, and six mounting regions 34 are formed. FIG. 2C is a plane view of another exemplary embodiment, and twenty five mounting regions 34 are formed in the element mounting board 30 shown in FIG. 2C.

As described earlier, the mounting regions 34 are mutually arranged in a matrix with a predetermined margin or interval provided therebtween, which is equal to the width of the slit ST1. In each mounting region 34, at least one tie bar 35 is provided on each of two lateral sides extending in a row direction, namely two horizontal lateral sides extending in the horizontal direction. And at least one tie bar 35 is provided on each of two lateral sides extending in a column direction, namely two vertical lateral sides that are disposed counter to each other. In other words, four tie bars 35 are provided around each mounting region 34.

The relationship between the frame 32 and the tie bar 35 is now explained. A left (right) frame 32a (32b) extending vertically is connected to the vertical lateral sides of mounting regions 34a and 34b (34e and 34f), which are internally adjacent to the frame 32a (32b), by way of the tie bars 35. Similarly, a top (bottom) frame 32c (32d) extending horizontally is connected to the horizontal lateral sides of mounting regions 34a, 34c and 34e (34b, 34d and 34f), which are internally adjacent to the frame 32c (32d), by way of the tie bars 35.

If the mounting regions 34 are configured by two rows and three columns, all the mounting regions 34a to 34f are connected by the frames and the tie bars 35. If, however, there are an increased number of mounting regions 34 as shown in FIG. 2C, some of the mounting regions 34 will be configured such that they are connected to the frames 32 by the tie bars 35 while the remaining of the mounting regions 34 will be configured such that the mounting regions 34 are connected by the tie bars 35 only.

In FIGS. 2A to 2C, the mounting regions 34a to 34f are rectangular and therefore the slits are L-shaped, T-shaped and cross-shaped. If an enhanced breakdown strength is intended and taken into consideration accordingly, recesses 46 may be formed as will be described later in conjunction with FIGS. 8A to 8E. Although a detailed description will be given later, the recesses 46 are formed inside a lateral side portion of a mounting region 34 that connects to a tie bar 35.

Also, the tie bars 35 may be made thinner than other parts. If, for example, the top and bottom faces of each tie bar are pressurized by etching and pressing and thereby the thickness thereof gets smaller, the exposed area of Al will be reduced when the tie bars 35 are cut later.

Figure 3:
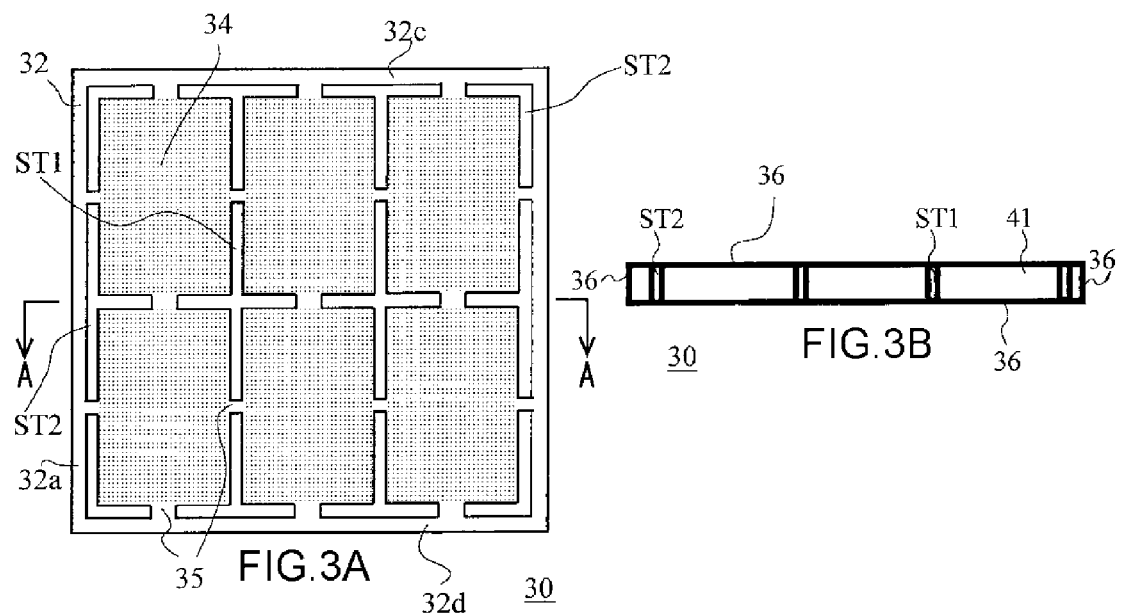
FIGS. 3A and 3B are diagrams to explain a method for fabricating a semiconductor module according to a first embodiment.

Then, as shown in FIGS. 3A and 3B, an insulating film (layer) 36 is formed on the surfaces of the element mounting board (large-sized substrate) 30. Here, the surfaces of the element mounting board 30 are a top face, a reverse face, and four lateral sides of the mounting region 34, which connect the top face and the reverse face. If, instead of a rectangle, the shape of the mounting region 34 is a circle, a triangle, a pentagon, a hexagon, . . . , and a n-sided polygon, the number of lateral sides will be 1, 3, 5, 6, . . . , and n, respectively. The tie bars 35 are classified into two types. For a first type, a tie bar 35, which connects vertically to a mounting region 34, has left and right lateral sides, the top face, and the reverse side. For a second type, a tie bar 35, which connects horizontally to a mounting region 34, has upper and lower lateral sides, the top face, and the reverse side. These tie bars 35 are spaced separately in between the mounting regions 34 or between the mounting region 34 and the frame 32. Thus, a slightly raised portion is formed outwardly from a lateral side of the mounting region 34, and a metal is exposed on the thus separated faces of the mounting region 34.

A description is given herein of the insulating film 36. The insulating film 36 is generated by subjecting it to a reaction where a metal in the element mounting board 30 is denatured or altered. For example, the insulating film 36 is generated such that the surface of the metal is subjected to an oxidation reaction treatment. Such a method for generating the insulating film 36 may be an anodic oxidation method, an in-liquid plasma oxidation method or the like, for instance.

In the anodic oxidation method, the aluminum substrate is immersed into an electrolytic solution (sulfuric acid, oxalic acid and other organic acids) and a weak direct current (DC), alternate current (AC) or a AC-DC current is applied with this substrate as the anode, thereby forming an oxide film (anodic oxide film) on the surface of the substrate. By employing this method, oxide films having various characteristics can be produced by combining, in various manners, the conditions of the electrolyte solution and/or the types of aluminum alloys. Here, the conditions of the electrolyte solution include the type, the concentration, the temperature and the current density of electrolyte solution, for instance. Furthermore, the anodic oxide film has many micropores (the diameter: 0.01 to 0.05 μm, 60 to 800 micropores/μm$^2$). Thus, these micropores may be sealed off in a manner such that the anodic oxide film is put into a pressure vessel where steam is blown in for the pressurization, or such that the anodic oxide film is put into boiling water and then aluminum hydroxide is formed on the surface layer of the anodic oxide film. This can smooth the surface thereof and simultaneously enhance the breakdown strength. This treatment is generally called a sealing treatment.

The in-liquid plasma oxidation method is a technique by which to generate plasma in a liquid. For example, the aluminum substrate is immersed into an aqueous neutral or alkaline electrolytic solution and a pulse current is applied with this substrate as the anode. Thereby, a plasma discharge is generated at a contact interface of the substrate and the electrolytic solution and then an oxide film is formed on the surface of the substrate. This method is characterized by the feature, for instance, that the film deposition rate is faster and the breakdown strength is higher as compared to the anodic oxidation method. The oxide film produced by employing this method may be a ceramic film formed of alpha-alumina and gamma-alumina, for instance.

The thus produced insulating film 36 is indicated by the bold lines in FIG. 3B.

Figure 4:
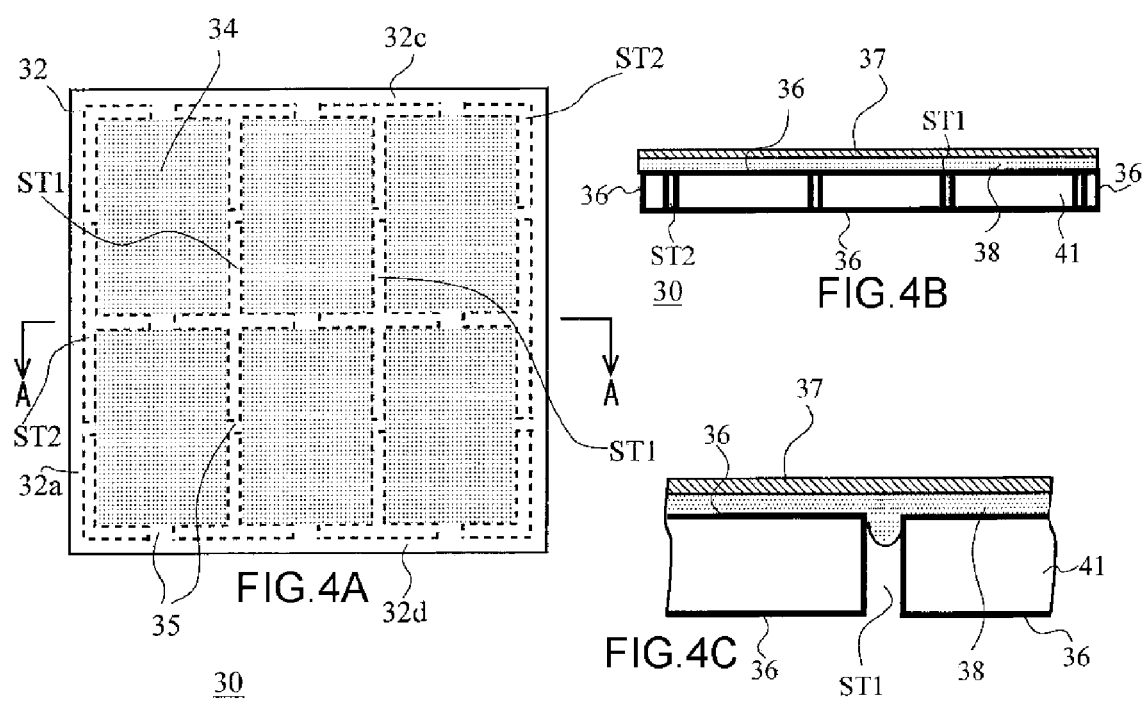
FIGS. 4A to 4C are diagrams to explain a method for fabricating a semiconductor module according to a first embodiment.

Then, as shown in FIG. 4, a Cu foil 37 is affixed. In general, the Cu foil 37 in the reverse face of which an insulating resin 38, serving as an adhesive, is provided is prepared and then the Cu foil 37 is subjected to thermocompression bonding. FIG. 4C is an enlarged view of a cross section of the element mounting board 30 near the slit ST1. As shown in FIG. 4C, there are cases where the insulating resin 38 melts and partially flows into the slit ST1 when it is heated and pressurized. Note that the insulating resin 38 may be provided in a manner such that a film-like resin is bonded or such that a liquid resin is applied by using a screen printing method, a spinner method or the like. Or alternatively, the insulating resin may be provided on the element mounting board 30 and then the Cu foil 37 may be bonded to the insulating resin.

Figure 5:
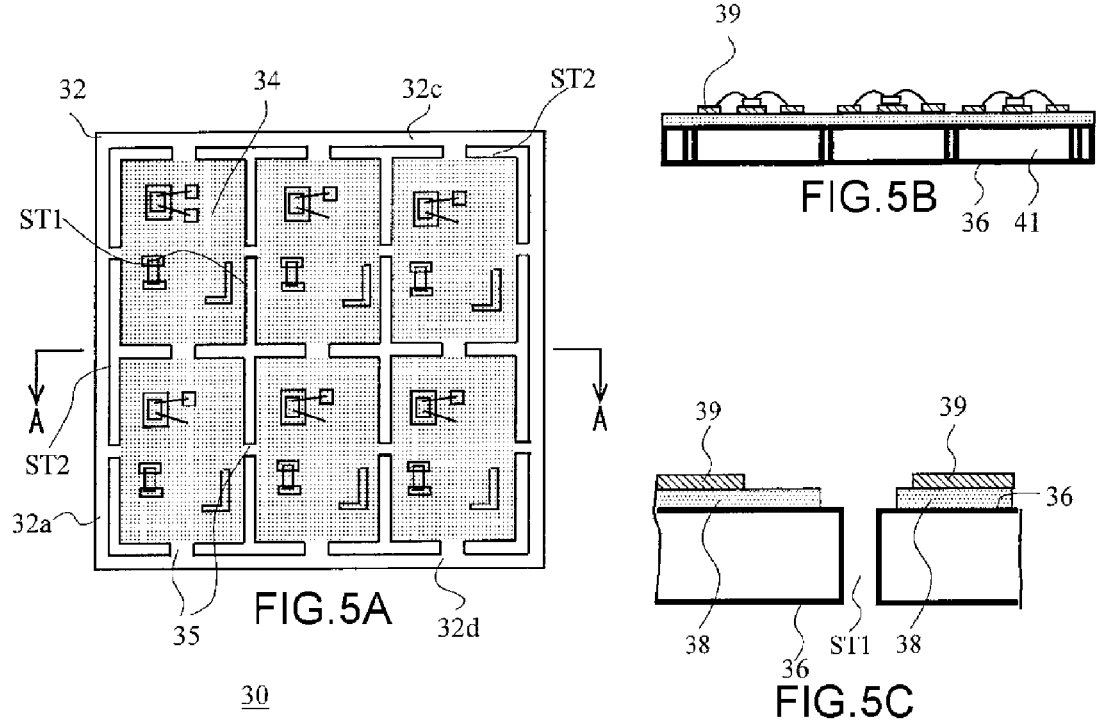
FIGS. 5A to 5C are diagrams to explain a method for fabricating a semiconductor module according to a first embodiment.

Then, as shown in FIGS. 5A to 5C, the Cu foil 37 is patterned, and semiconductor elements, passive elements and so forth are mounted.

At this stage, the Cu foil 37 is first etched and patterned. A Cu pattern 39 thus produced includes pads for thin metallic wires, pads for leads, islands, wirings, and so forth. If a semiconductor element is mounted face-up or face-down, a portion connected to an electrode of a semiconductor element will be a pad; if it is mounted face-up, an island serves as a fixed area of the semiconductor element. If it is a hybrid IC device, there will be an additional pad through which the passive elements are electrically connected to the hybrid IC device. This pad is an area where the electrodes of chip resistors and chip capacitors are fixed by solders or the like. The etching is achieved by wet etching but may be achieved by dry etching.

The etching has the Cu pattern 39 recede inwardly from the periphery of the mounting region 34. Thus, when the tie bar 35 is to be cut, this receded region on the Cu pattern 39 is not suitable for a portion to be press-cut and is avoided accordingly.

Then, a part of the insulating resin 38 corresponding to the slit ST1 is removed. The part of the insulating resin 38 may be removed by etching or extracted using laser. Although discussed later, the part of the insulating resin 38 may not be removed at this stage but it may be mechanically removed simultaneously when the tie bar 35 is cut.

Finally, there is a sealing process if necessary. If, for example, the semiconductor elements are not mounted in a bare chip state but are normally packaged, the tie bars 35 may be cut, as they are, by means of press-cutting and then the semiconductor modules may be shipped as final products. When the elements have been mounted on the element mounting board 30, the process is completed as with a printed circuit board module mounted in a electronic appliance. For example, such a printed circuit board module may be an LED module or the like.

If, however, the semiconductor elements are bare chips or need to be environmentally resistant, they will be sealed by the sealing resin or case material.

Figure 6:
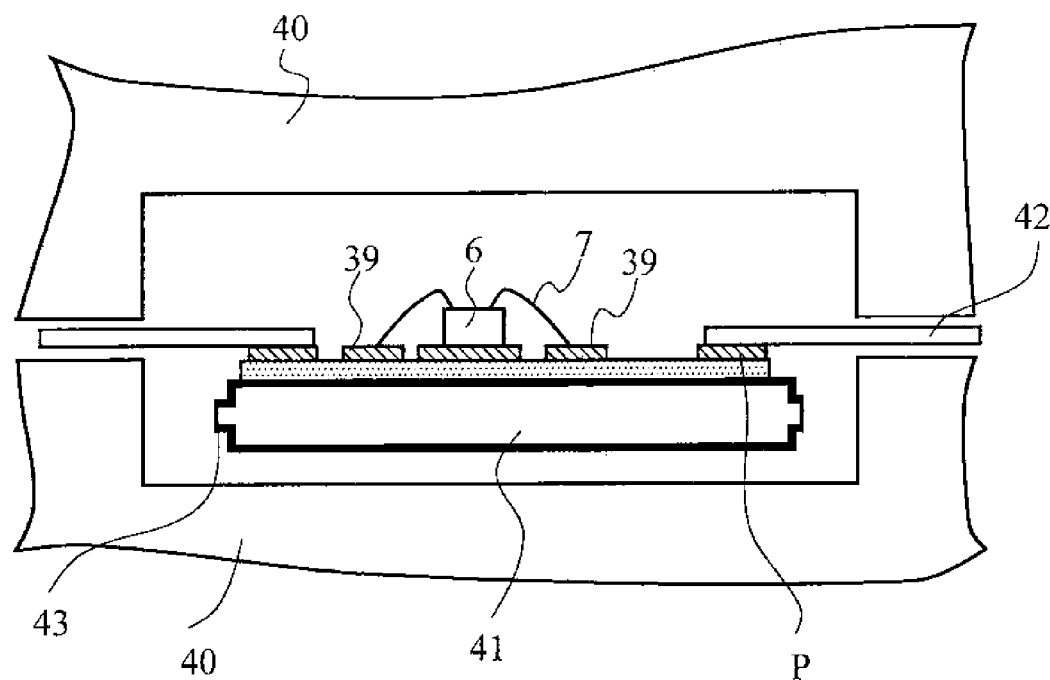
FIG. 6 is a diagram to explain a method for fabricating a semiconductor module according to a first embodiment.

In FIG. 6, the tie bars 35 are cut and the substrate sheet is separated into individual pieces after the previous process. Then the semiconductor module is sealed using a resin sealing mold 40. The transfer-mold method is used here. A pad P for use in an external lead 42 is provided in each lateral side of a substrate 41 separated after the tie bars 35 of the element mounting board 30 have been cut. And the lead 42 is attached to the pad P. The leads 42 of SIP (Single Inline Package) type or DIP (Dual Inline Package) type are attached thereto. Then, the lead 42 is interposed and held between the molds provided above and below the lead 42, and resin is injected through a gate of the molds and cured.

Besides the transfer-mold method, an injection mold method or potting method may be used to seal the semiconductor module. Hollow sealing may be done using the case material. Further, a resin such as silicone may be contained in the hollow of casing.

FIG. 6 shows a state where a residual part 43 of the tie bars 35 still remain. It is difficult to remove the tie bars in alignment with the periphery of the substrates separated by the dicing. If it is to forcibly achieve the alignment between the periphery thereof and the tie bars, the periphery of the substrates may be damaged. For these reasons, the residual parts 43 are left intact there on purpose. A metal is exposed on a cutting plane of the residual part 43 of the tie bar.

A description is now given of an element mounting board, which has been separated by the dicing, with reference to FIGS. 7A to 7H. FIG. 7A is a plane view of the substrate 41 that has been separated by the dicing. FIG. 7B and FIG. 7C are side views of the substrate 41 as viewed from a shorter side and a longer side thereof, respectively. The substrate 41 is one obtained when a large-sized element mounting board 30 has been cut into pieces by cutting the tie bars 35. A part of each tie bar 35 is remained there at the time of cutting and is of a shape such that the part thereof protrudes from a lateral face of the substrate 41. As shown in FIGS. 7B and 7C, an exposed part 44 is formed on an end face of each protrusion. The metal (aluminum), which is the material of the substrate 41, is exposed in the region of the exposed part 44.

In the first embodiment, the substrate 41 is coated all over with an oxide film, which is an insulating material, except for the exposed part 44 of the lateral faces of the substrate. Thus, even when a high voltage is applied at the startup of the semiconductor module, a circuit in the semiconductor module and the casing of equipment or the like are not short-circuited. In order to further improve the withstand voltage, the metal exposed on a part of the aforementioned lateral faces of the substrate may be coated with an insulating material (more specifically, an insulating resin, glass, or the like).

FIG. 7D is an enlarged view of the element mounting board in the planar direction to explain the growth of an oxide film 36. In the process of forming the oxide film described in conjunction with FIGS. 3A and 3B, an enhanced local oxidation takes places at the corners due to the electric field concentration there and therefore the oxide film grows such that the thickness of the oxide film increases toward each corner. When a high voltage is applied at the startup of the semiconductor module, the electric field concentration is more likely to occur at the corners of the metallic substrate and that the corners and the casing of equipment or the like is likely to be short-circuited. In the present embodiment, however, the oxide film at each corner is formed such that the thickness thereof is made larger, so that the breakdown strength can be improved. That is, the thickness of the oxide film at the corners is larger than that at the other regions than the corners.

FIG. 7E is a plane view showing an exemplary embodiment where the large-sized element mounting board 30 is separated at partial regions of the element mounting board 30 and it is not separated by the tie bars 35. FIG. 7F is an enlarged view of a connection portion that connects a tie bar 35, before the separation, to the element mounting board 30. As indicated by the dotted line in FIG. 7F, the press-cutting is done such that a recess 45 is formed in a region slightly larger than the connection portion of the tie bar 35, so that the shape, as shown in FIG. 7E, of the element mounting board 30 can be obtained. As seen in a plane, three lateral faces of each recess 45 are sides that are newly formed by the cutting, and aluminum is exposed on the lateral faces.

FIGS. 7F and 7H are a plane view and a side view, respectively, showing an exemplary embodiment where an oxide film is formed after a region of the tie bar 35 is thinly etched and where the press-cutting is done at the region of the tie bar 35 similar to FIG. 7A so as to separate the substrate sheet into individual pieces. In the first embodiment, the oxide film is formed after the region of the tie bar 35 has been thinly etched and therefore the region where the metal (aluminum) is exposed at the press-cutting is minimized, so that the breakdown strength can be improved.

Second Embodiment

Figure 8A:
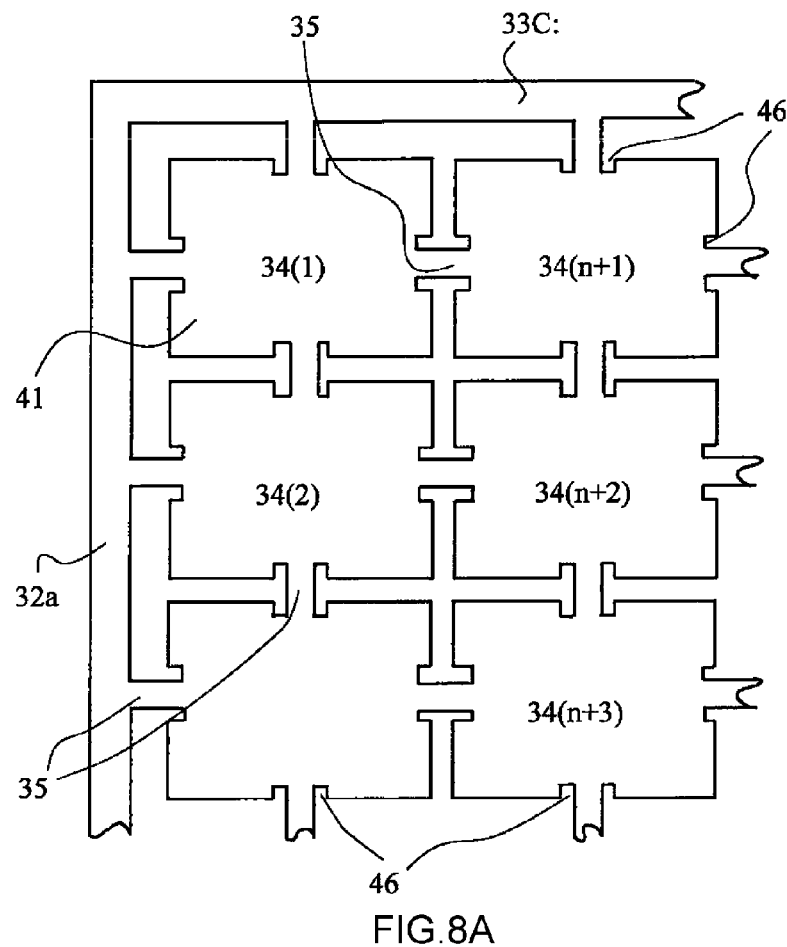
FIGS. 8A to 8E are diagrams to explain a method for fabricating a semiconductor module according to a second embodiment.
Figure 8B:
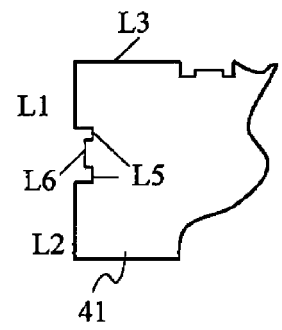
Figure 8C:
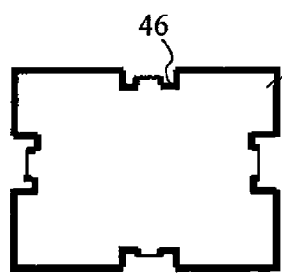
Figure 8D:
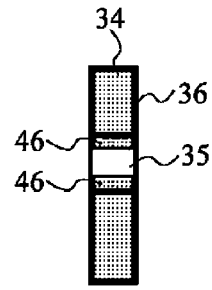
Figure 8E:
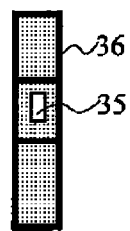

FIG. 8A is a plane view of an element mounting board 30 where recesses 46 are formed in the mounting regions 34 in the above-described slit formation process. FIG. 8B is an enlarged view showing the vicinity of a tie bar region after the element mounting board 30 of FIG. 8A has been separated into individual pieces.

As shown in FIG. 8B, the substrates 41 are press-cut at the regions of the tie bars 35 and separated into individual pieces. A press-cutting position L6 at the tie bar 35 is located nearer the substrate 41 than a lateral face L1 and a lateral face L2 of the substrate 41. Also, the press-cutting position L6 is located at a position slightly farther than sides L5, which form and are part of the recess 46. As shown in FIG. 8A, the oxide film is formed after the recesses 46 have been formed in the mounting region 34, and the substrate 41 is press-cut at the region of the tie bar 35. Hence, in the separated substrate 41, the metal (aluminum) is exposed on a side only, which is denoted by L6 in FIG. 8B. When the oxide film is formed, without having the region of the tie bar 35 thinly etched, and then the substrate 41 is press-cut, the metal (aluminum) is exposed on only the white space of a side view shown in FIG. 8D. When the oxide film is formed after the region of the tie bar 35 has been thinly etched, and then the substrate 41 is press-cut, the metal (aluminum) is exposed on only the white space of a side view shown in FIG. 8E.

In the second embodiment, an exposed part of the metal (aluminum) is located inwardly from each lateral face of the substrate 41. Thus, the second embodiment achieves a high effect of preventing the short-circuiting between a circuit in the semiconductor module and the casing of equipment or the like when a high voltage is applied at the startup of the semiconductor module.

Third Embodiment

Technical Field of Third Embodiment

A third embodiment relates to an element mounting board formed, a semiconductor module, and a method for fabricating the element mounting board.

(Background Technology of the Third Embodiment)

In the conventional practice, an element mounting board (see Reference (6) in the following Related Art List) is known as an element mounting board on which to mount the power semiconductor elements such as a MOSFET (Metal-Oxide-Semiconductor Field-Effect Transistor) and IGBT (Insulated Gate Bipolar Transistor). Such an element mounting board as one disclosed in Reference (6) is structured such that an insulating resin layer is stacked on the main surface of a metallic substrate and such that a wiring layer is provided on the insulating resin layer.

RELATED ART LIST (6) Japanese Patent Application Publication No. 2003-303940.
(7) Japanese Patent Application Publication No. 2008-218596.

(Problems to be Resolved by Third Embodiment)

In general, in the aforementioned element mounting board, an oxide film is formed on the surface of the metallic substrate in order to prevent the corrosion and the like of the metallic substrate. And the insulation between the wiring layer and the metallic layer is ensured by provision of an insulating oxide film and an insulating resin layer, which are inserted and held between the wiring layer and the metallic substrate.

In the aforementioned element mounting board, the electric field is more likely to be concentrated in peripheral regions (corners) of the metallic substrate. A possibility of dielectric breakdown and its consequent short-circuiting between the wiring layer and the peripheral regions of the metallic substrate is higher than that in other regions. When the wiring layer is provided particularly near the peripheral regions of the metallic substrate, the possibility of short-circuiting between the peripheral regions of the metallic substrate and the wiring layer increases.

When the metallic substrate is formed by subjecting a single metallic sheet to a punching process, there are cases where the burrs, protruding from the man surface of the metallic substrate, are formed at peripheral regions of the metallic substrate. When the burrs are formed at the peripheral regions of the metallic substrate, the possibility of short-circuiting between the wiring layer and the peripheral regions of the metallic substrate increases because the electric field is more likely to be concentrated on the tip of burrs.

A crack or chipping (cracking) occurs in a structure where the metallic substrate is stamped out at once after the oxide film has been formed on an end face of the metallic substrate. If the cracking or chipping like this occurs, the proper function of the insulating layer will be lost and the creeping discharge breakdown voltage characteristic of circuit board and the insulation will be degraded. Thus there arises a problem to be solved where the reliability of the circuit board degrades and the circuit cannot be used in high voltage.

In order to help further improve the reliability of the element mounting board, it is necessary to enhance the insulation between the wiring layer and the peripheral regions of the metallic substrate and reduce the possibility of short-circuiting therebetween.

The third embodiment has been implemented in view of the foregoing circumstances, and the third embodiment provides a technology for enhancing the insulation between the wiring layer and peripheral regions of the metallic substrate in the element mounting board.

(Means for Solving the Problems in the Third Embodiment)

One exemplary mode of the third embodiment relates to an element mounting board. The element mounting board includes: a metallic substrate; an oxide film formed such that surfaces of the metallic substrate are oxidized; an insulating resin layer provided on the oxide film that faces one main surface of the metallic substrate; and a wiring layer provided on the insulating resin layer, wherein the oxide film has a thick film portion in at least part of peripheral regions in the oxide film facing the one main surface of the metallic substrate, the thick film portion being such that the thickness of the thick film portion in the part of peripheral regions is greater than that of the other parts of the oxide film formed in the surface of the metallic substrate.

By employing this exemplary mode thereof, the insulation properties between the wiring layer the metallic substrate in the element mounting board can be enhanced.

Another exemplary mode thereof relates to a semiconductor module. The semiconductor module includes: an element mounting board according to the above-described exemplary mode thereof; and a semiconductor element electrically connected to the wiring layer, the semiconductor element being mounted on a main surface of the element mounting board on a side where the wiring layer is formed.

Still another exemplary mode thereof relates to a method for fabricating an element mounting board. The method for fabricating an element mounting board includes the steps of: forming a metallic substrate by a process of separating a metallic sheet into individual pieces; roughing a surface of a protrusion formed, in at least part of a peripheral region of the metallic substrate, by the process of separating the metallic sheet into individual pieces; forming an oxide film on a surface of the metallic substrate by performing an oxidation treatment; stacking an insulating resin layer on the oxide film provided on a main surface of the metallic substrate at a downstream side of a punching direction in the process of separating the metallic sheet into individual pieces; and forming a wiring layer in a manner such that a metal layer is stacked on the insulating resin layer and then the metal layer is selectively removed.

Figure 11A:
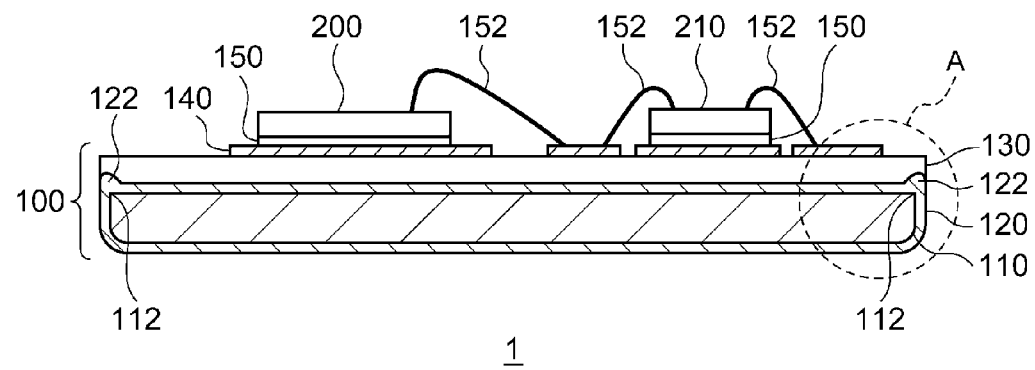
FIG. 11A is a cross-sectional view showing a rough structure of a semiconductor module including an element mounting board according to a third embodiment.
Figure 11B:
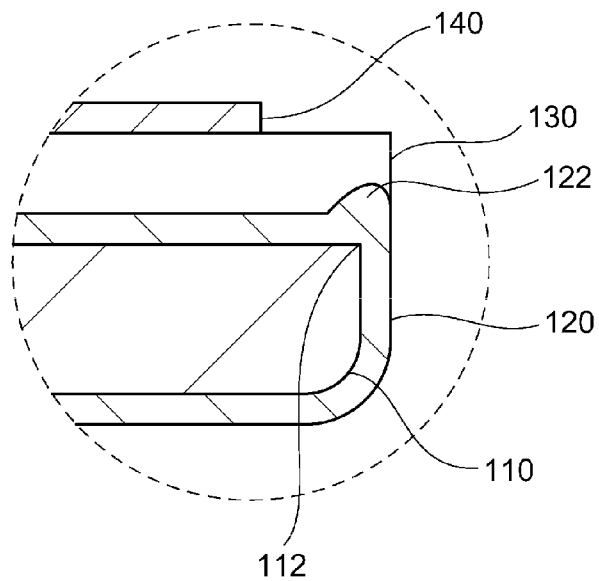
FIG. 11B is an enlarge view of region A encircled by a dashed line in FIG. 11A.

A description is given hereunder of the third embodiment with reference to with reference to FIG. 11A to FIG. 14C. FIG. 11A is a cross-sectional view showing a rough structure of a semiconductor module including an element mounting board according to the third embodiment. FIG. 11B is an enlarge view of region A encircled by a dashed line in FIG. 11A. A semiconductor module according to the third embodiment includes an element mounting board 100 and semiconductor elements 200 and 210 mounted on one main surface of the element mounting board 100. The semiconductor element 200 is a power transistor, such as a transistor, IGBT or MOSFET. The semiconductor element 210 is a control semiconductor element such as a control IC or the like.

The element mounting board 100 is comprised of a metallic substrate 110, an oxide film 120, an insulating resin layer 130, and a wiring layer 140.

The metallic substrate 110 may be a substrate formed of a metal, which displays good thermal conductivity, such as aluminum or an aluminum alloy. In the third embodiment, the metallic substrate 110 is an aluminum substrate. The thickness of the metallic substrate 110 may be 0.5 mm to 2 mm, for instance.

The oxide film 120 is an insulating film formed such that the surface of the metallic substrate 110 is oxidized. In the third embodiment, the oxide film 120 is formed of aluminum oxide (alumina). The oxide film 120 coats the entire surface of the metallic substrate 110. Also, the oxide film 120 has a thick film portion 122 in at least part of peripheral regions in the oxide film 120 facing one main surface of the metallic substrate 110. Here, the thickness of the thick film portion 122 is greater than that of the other parts of the oxide film 120 formed in the surface of the metallic substrate 110. The thickness of the thick film portion 122 is greater than that at a central part of the oxide film 120, for instance. The thick film portion 122 is formed such that oxidized is a burr, which has been formed in the formation of the metallic substrate 110 by performing the punching process on the metallic sheet.

More specifically, the thick film portions 122 are formed at the peripheral regions of the oxide film 120 that covers one main surface of the metallic substrate facing the wiring layer 140. In other words, the thick film portion 122 is formed in a position of a peripheral region 112 where, as seen from a direction perpendicular to the main surface of the element mounting board 100, the main surface of the metallic substrate 110 facing the wiring layer 140 meets a lateral face of the metallic substrate 110.

The thick film portion 122 is provided along the entire circumference of the peripheral region, for example. Or alternatively, the film thick portion 122 may be provided in part thereof. If the thick film portion 122 is provided in part thereof, an advantageous effect described later will be achieved in the part thereof. The thickness of the oxide film 120 may be such that the thickness of the thick film portion 122 is, for example, 1.05 to 1.25 times the thickness of the oxide film 120 excluding the thick film portions 122.

The oxide film 120 is an insulating film. Thus, having the thick film portion 122 in the peripheral region 112 of the oxide film 120 can suppress the short-circuiting between the peripheral region 112 and the wiring layer 140 as a result of the concentration of electric field on the peripheral regions 112 of the metallic substrate 110.

The insulating resin layer 130 is provided on the oxide film 120 that faces one main surface of the metallic substrate 110. The insulating resin layer 130 is laminated on a main surface of the oxide film 120 having the thick film portion 122. The material used to form the insulating resin layer 130 may be, for instance, a melamine derivative, such as BT resin, or a thermosetting resin, such as liquid-crystal polymer, epoxy resin, PPE resin, polyimide resin, fluorine resin, phenol resin or polyamide bismaleimide. From the viewpoint of improving the heat radiation of the element mounting board 100, it is suitable that the insulating resin layer 130 has a high thermal conductivity. In this respect, the insulating resin layer 130 contains, as a high thermal conductive filler, alumina, aluminum nitride, silica, or the like, for instance. Thereby, the heat generated by the power semiconductor element 200 in particular can be released efficiently. The thickness of the insulating resin layer may be 50 μm to 250 μm, for instance.

The wiring layer 140 is provided on top of the insulating resin layer 130. The wiring layer 140, which is formed of copper, for instance, has a predetermined wiring pattern shape. A par of the wiring layer 140 is provided near the peripheral region 112 of the metallic substrate 110. The thickness of the wiring layer 140 may be 10 μm to 150 μm, for instance.

The semiconductor elements 200 and 210 are mounted on the main face of the element mounting board 100 on a side thereof where the wiring layer 140 is formed. Element electrodes (not shown) at lower surface sides of the semiconductor elements 200 and 210 are electrically connected to the wiring layers 140 (electrodes) by way of solders 150. Element electrodes (not shown) at upper surface sides of the semiconductor elements 200 and 210 are wire-bonded to the wiring layers 140 using aluminum wires 152, for instance. In the present embodiment, an aluminum wire 152 connected to one of the element electrodes at the upper surface of the semiconductor element 210 and another aluminum wire 152 connected to one of the element electrodes at the upper surface of the semiconductor element 200 are both connected to a part of the wiring layer 140. For example, a control signal with which to control the operation of the semiconductor element 200 is transmitted from the semiconductor element 210 to the semiconductor element 200, and the semiconductor element 200 performs a switching operation according to the control signal.

(A Method for Fabricating an Element Mounting Board and a Semiconductor Module)

Figure 12A:
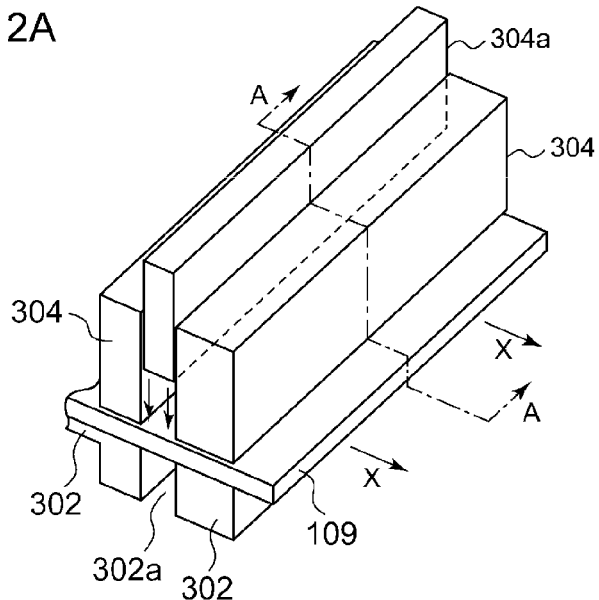
FIGS. 12A to 12D are cross-sectional/perspective views to explain an outline of processes in a method for fabricating an element mounting board and a semiconductor module according to a third embodiment.
Figure 12B:
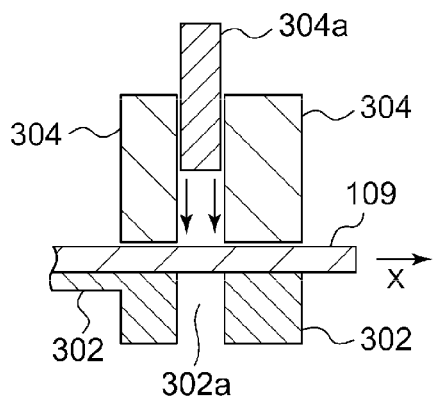

A manufacturing process for a semiconductor module including an element mounting board according to the third embodiment will now be described with reference to FIGS. 12A to 12D, FIGS. 13A to 13D, and FIGS. 14A to 14C. FIGS. 12A to 12D, FIGS. 13A to 13D, and FIGS. 14A to 14C are cross-sectional views to explain an outline of processes in a method for fabricating an element mounting board and a semiconductor module according to the third embodiment. FIG. 12A is a perspective view of a press machine. FIG. 12B is a cross-sectional view of the press machine and corresponds to a cross-sectional view taken along the line A-A of FIG. 12A. A cross-sectional view of FIG. 12C(ii) corresponds to a cross-sectional view taken along the line B-B of a metallic substrate shown in a perspective view of FIG. 12C(i).

As illustrated in FIGS. 12A and 12B, a metallic sheet 109 formed mainly of aluminum is first prepared. The metallic sheet 109 is a large-sized plate before being subjected to the punching process where it is separated into individual metallic substrates 110. Here, the metallic sheet 109 is of an approximately square shape with the side length of 100 mm to 1000 mm, for instance. Then, the metallic sheet 109 is placed on top of a lower mold 302. A through-hole 302a in accordance with the shape of the metallic substrate 110 is formed in the lower mold 302. Then a punch section 304a of an upper mold 304 aligned with the through-hole 302a is moved toward the lower mold 302, and the metallic sheet 109 is stamped out so as to be cut. Then, the punch section 304a is retracted upward and the metallic sheet 109 is moved to a direction of arrow X by a predetermined distance. And the metallic sheet 109 is again stamped out with the punch section 304a so as to be cut. This operation is repeated, thereby forming a plurality of belt-shaped metallic sheets. The thus obtained belt-shaped metallic sheets are set again in the press machine and cut in a direction vertical to the long-side direction so as to separate the metallic sheet into individual pieces.

Figure 12C:
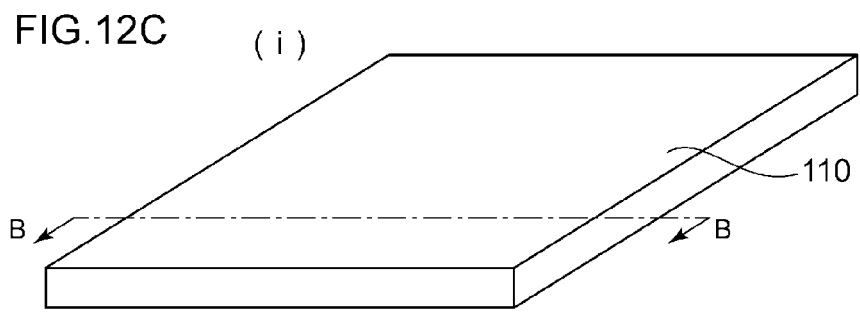

As a result, as shown in FIG. 12C(i) and FIG. 12C(ii), a metallic substrate 110 is formed. Protrusions 114 protruding in a direction perpendicular to a main surface is formed in this main surface of the metallic substrate 110. Here, this main surface thereof is positioned at a downstream side of a punching direction in the punching process. The downstream side corresponds to a lower surface side in FIG. 12C. This protrusion 114 is a burr formed during the punching process.

Figure 12D:
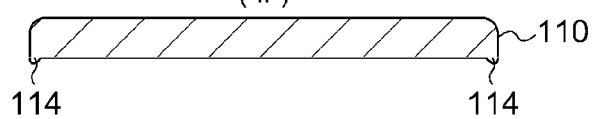

Then, as shown in FIG. 12D, for the purpose of roughing the surface of the protrusion 114 formed in the punching process, the metallic substrate 110 is immersed in a sulphuric acid solution 400, for example, and the surface of the metallic sheet 109 is subjected to a slight etching. During the punching process of the metallic sheet 109, a conspicuous processing strain occurs in the protrusions 114 of the metallic substrate 110. As a result, a large number of fine crystal grains are formed in the protrusions 114 as compared with other regions of the metallic substrate 110. Thus, performing the etching on the surface of the metallic substrate 110 forms a finer roughness or finer asperities on the surface of the protrusions 114 than in other regions of the metallic substrate 110.

Then, an oxide film 120 is formed on the surface of the metallic substrate 110 by performing an oxidation treatment. In the third embodiment, as shown FIG. 13A, the metallic substrate 110, which is connected to a positive electrode of a not-shown power supply, is immersed in an oxalate solution 410, for instance. Also, cathode terminals 412, which are each connected to a negative electrode of the power supply, are disposed counter to each other at predetermined intervals from both main surfaces of the metallic substrate 110 (i.e., the metallic substrate 110 are interposed between the cathode terminals 412 spaced apart from the metallic substrate 110 at the predetermined intervals, respectively). Then, the metallic substrate 110 undergoes anodic oxidation and, thereby, an oxide film formed of aluminum oxide is formed on the surface of the metallic substrate 110. The oxidation treatment of the metallic substrate 110 may be achieved by the use of a plasma oxidation. In this plasma oxidation, an alternate current is applied between the metallic substrate 110, which serves as the positive electrode, and the negative electrodes in a neutral or alkaline treatment liquid, and a plasma discharge (micro arc) is generated so as to oxidize the surface of the metallic substrate 110.

Figure 13A:
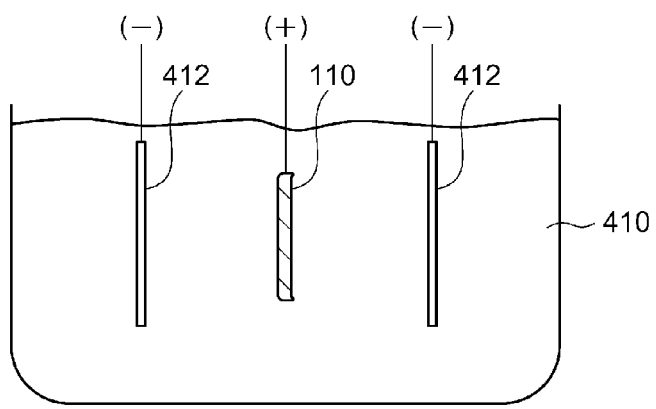
FIGS. 13A to 13D are cross-sectional views to explain an outline of processes in a method for fabricating an element mounting board and a semiconductor module according to a third embodiment.
Figure 13B:
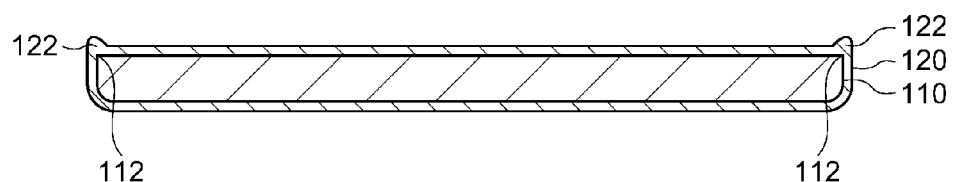

The oxidation treatment of the metallic substrate 110 forms a surface layer, made of the metallic substrate 110, which is the oxide film 120. As a result, as shown in FIG. 13B, the surface of the metallic substrate 110 is coated with the oxide film 120. As described above, the metallic substrate 110 is formed such that finer asperities are formed on the surface of the protrusions 114 as compared with other regions on the surface of the metallic substrate 110. Thus, the protrusions 114 are more likely to be oxidized than other regions on the surface thereof. Hence, the thick film portions 122, whose film thickness is larger than that of other regions on surface thereof, is formed in the peripheral regions 112 of the metallic substrate 110. In the third embodiment, the protrusion 114 is oxidized in its entirety so as to form the thick film portion 122.

Figure 13C:
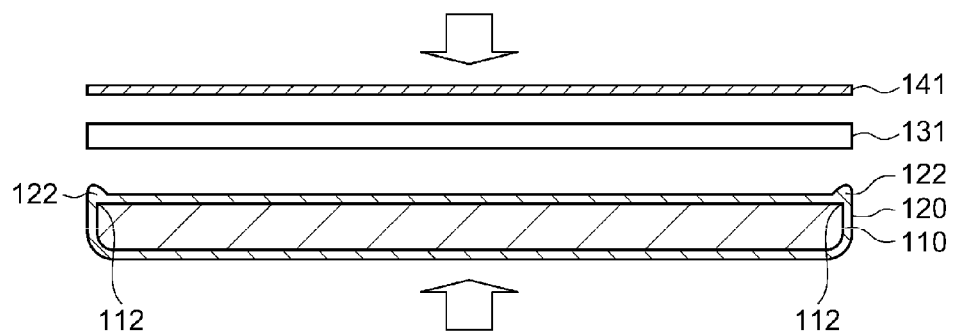

Then, as shown in FIG. 13C, an insulating resin film 131 is placed on top of the oxide film 120, which is provided at a downstream side of a punching direction in the punching process, namely which is provided on the main surface of the metallic substrate 110 on a side where the protrusions 114 are formed. A metallic foil 141, such as copper foil, is placed above the insulating resin film 131. Then, the metallic substrate 110, the insulating resin film 131 and the metallic foil 141 are press-bonded together using the press machine.

Figure 13D:
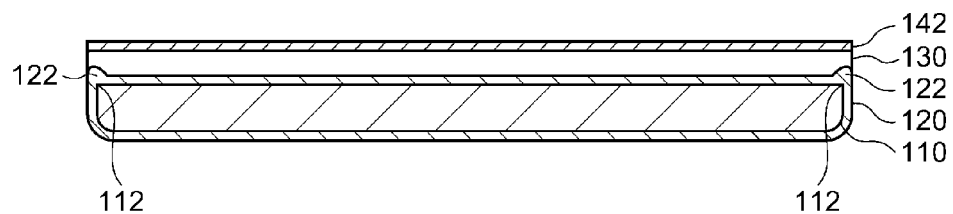

As shown in FIG. 13D, the insulating resin layer 130 is laminated on top of the oxide film 120, which has been formed on the main surface of the metallic substrate 110. Also, a metal layer 142 is laminated on top of the insulating resin layer 130. That is, the insulating resin film 131 becomes the insulating resin layer 130, and the metallic foil 141 becomes the metal layer 142.

Figure 14A:
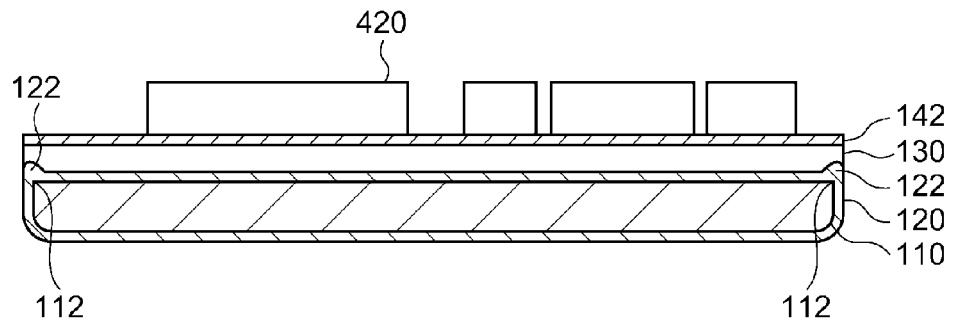
FIGS. 14A to 14C are cross-sectional views to explain an outline of processes in a method for fabricating an element mounting board and a semiconductor module according to a third embodiment.

Then, as shown in FIG. 14A, resists 420 are selectively formed according to a pattern of the wiring layer 140 using known photolithography.

Figure 14B:
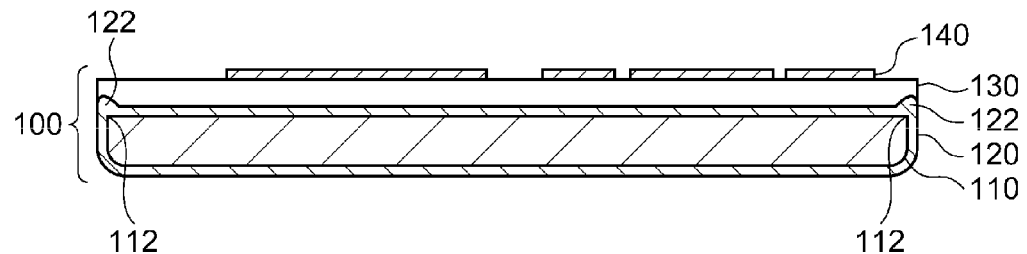
Figure 14C:
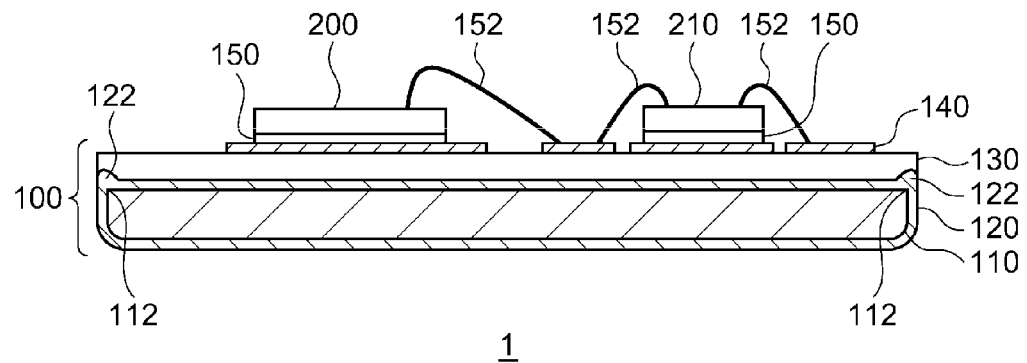

Then, as shown in FIG. 14B, the metal layer 142 is selectively removed by etching the metal layer 142 with the resists 420 used as a mask, thereby forming the wiring layer 140 of a predetermined pattern. After the formation of the wiring layer 140, the resists 420 are removed using a remover. Through the processes as described above, the element mounting board 100 according to the third embodiment is formed.

Then, as shown in FIG. 4C, the semiconductor elements 200 and 210 are mounted on the wiring layers 140 by way of solders 150. The element electrodes at upper surface sides of the semiconductor elements 200 and 210 are electrically connected to the wiring layers 140 by using a wire bonding method. Through the processes as described above, the semiconductor module 1 according to the third embodiment is formed.

As described above, in the element mounting board 100 according to the third embodiment, the oxide film 120, which is formed on the main surface of the metallic substrate 110 facing the wiring layer 140, has the thick film portions 122 in the peripheral regions, wherein the thickness of the thick film portions 122 is greater than that of the other parts of the oxide film 120 than the peripheral regions. This can enhance insulation between the wiring layer 140 and the peripheral regions 112 of the metallic substrate 110. Even though a wiring layer 140 is provided particularly near the peripheral regions 112 of the metallic substrate 110 as in the third embodiment, the insulation therebetween can be kept. This structure therefore can reduce the possibility of dielectric breakdown occurring between the peripheral regions 112, where the electric field is relatively easily concentrated, and the wiring layer 140. As a result, the short-circuiting between them can be suppressed. Note that a region near the peripheral regions 112 of the metallic substrate 110 is a region, for example, where the insulation between the wiring layer 140 and the peripheral regions 112 of the metallic substrate 110 is not maintained in the structure having no film thick portions 122 provided in the peripheral regions 112 of the metallic substrate 110 as with the third embodiment.

Also, in the semiconductor module 1 according to the third embodiment, the semiconductor elements 200 and 210 are mounted on the element mounting board 100 the reliability of which has been improved. Thus, the reliability of the semiconductor module 1 can be improved.

Also, in the conventional practice, the metallic substrate is formed by stamping out the metallic sheet on which the oxide film has been formed. In such a case, on the surface of burrs formed in the peripheral regions of the metallic substrate, an oxide film, whose thickness is equal to that of the oxide film formed on the surface of a metallic substrate in other regions than the region of the oxide film where said burrs have been formed, is formed thereon. Thus, short-circuit may possibly occur between said burrs and the wiring layer. In contrast thereto, in the method for fabricating the element mounting board according to the third embodiment, the metallic substrate 110 is formed by subjecting the metallic sheet 109 to the punching process, then finer asperities are formed on the surface of the metallic substrate 110 by performing the etching on the surface thereof, and then the oxide film 120 is formed on the surface of the metallic substrate 110. This enables the oxide film 120 to have the thick film portions 122 by making use of the protrusions 114 formed in the peripheral regions 112 of the metallic substrate 110, namely the burrs. As a result, the short-circuiting between of the metallic substrate 110 and the wiring layer 140 can be prevented.

In the method for fabricating the element mounting board according to the third embodiment, the thick film portions 122 are formed by making use of the protrusions 114 formed in the punching process of the metallic sheet 109, so that the increase in the number of manufacturing processes necessary for the formation of the thick film portions 122 can be suppressed. When the semiconductor module is designed for a higher power use, a high voltage is applied to such a semiconductor module and therefore a higher breakdown strength is needed for the metallic substrate. In such a case, the thickness of the oxide film formed on the metallic substrate increases. Note that the oxide film is extremely harder than the metallic substrate itself. Thus, because of the increased thickness of the oxide film, it is difficult to carry out the punching process using the conventional method where the punching process is performed on the metallic sheet on which the oxide film has been formed. In contrast thereto, in the third embodiment, the oxide film 120 is formed after the metallic sheet 109 has undergone the punching process. Thus, the problem of the increased thickness of the oxide film formed on the metallic substrate in the case of a higher-power semiconductor module used can be addressed by the third embodiment.

(Modification)

Figure 15:
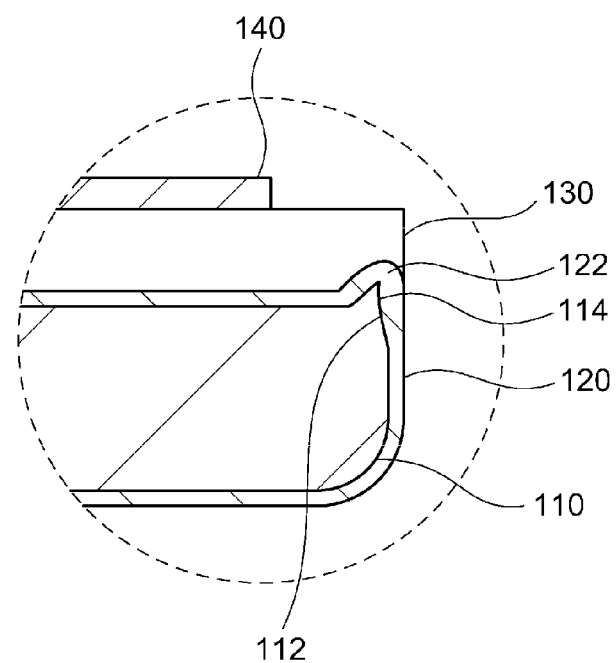
FIG. 15 is an enlarged view of a portion near a peripheral region of the element mounting board according to a modification.

FIG. 15 is an enlarged view of a near a peripheral region of the element mounting board according to a modification. FIG. 15 shows the same region as that shown in FIG. 11B. In the above-described third embodiment, the protrusion 114 is oxidized in its entirety and then the thick film portion 122 is formed. In contrast, as shown in FIG. 15, the metallic substrate 110 may have a protrusion 114 protruding in a direction perpendicular to a main surface of the metallic substrate 110, in at least part of the peripheral regions 112 on a main surface side of the substrate 110. This protrusion 114 is a part of the burrs formed when the metallic substrate 110 has been formed by the punching process of the metallic sheet 109. More specifically, this protrusion 114 is said part thereof that is remained there without being oxidized. Whether the burr is oxidized in its entirety as in the third embodiment or a part of the burrs is remained as in the modification depends on the duration or the like of the oxidation treatment of the metallic substrate 110.

The protrusion 114 is coated with the thick film portion 122. This structure can reduce the possibility of dielectric breakdown occurring between the protrusion 114 and the wiring layer 140 and its consequent short-circuiting therebetween even though the electric field is concentrated on the protrusion 114. Thus, the present modification achieves the same advantageous effects as those of the above-described embodiments.

Cracks or chipping (cracking) occur in the structure, as employed in the conventional practice, where the metallic substrate is stamped out at once after the oxide film has been formed on the metallic substrate. If the cracking or chipping like this occurs, the proper function of the insulating layer will be lost and the creeping discharge breakdown voltage characteristic of circuit board and the insulation will be degraded. Thus, in the conventional practice, there is a problem of grave concern to be solved where the reliability of the circuit board degrades and the circuit cannot be used in high voltage. In the present disclosure, however, the oxide film is formed after the metallic substrate has been stamped out. Thus the oxide film is formed also in the end face of the metallic substrate and therefore the circuit that excels in the creeping discharge breakdown voltage characteristic thereof can be produced.

The present disclosure is not limited to the above-described embodiments and modifications only, and it is understood by those skilled in the art that various further modifications such as changes in design may be made based on their knowledge and the embodiments added with such modifications are also within the scope of the present disclosure.

Although the metallic substrate is formed from the metallic sheet by a punching process, this process should not be considered as limiting and, for example, other processing methods such as a cutting or slitting process may be used to separate the metallic sheet into individual pieces.

The features and characteristics of the present disclosure described based on the above described exemplary embodiments may be defined by the following Item 1 to Item 19:

(Item 1) An element mounting board including:
a metallic substrate formed of metallic material;
an insulating layer provided on the metallic substrate; and
a pattern formed of a metal provided on the insulating layer,
wherein oxide films generated from the metallic material are provided in a surface of the metallic substrate, a reverse side disposed counter to the surface of the metallic surface, a surrounding lateral face connecting the surface of the metallic substrate and the reverse side thereof, and
the lateral face, on which the oxide film has generated, has an exposed portion where a partial surface of the metallic material is exposed.

By employing Item 1, in a lateral face where the oxide film has been generated, the exposed portion where the partial surface of the metallic substrate is exposed is made smaller than the entire lateral face. Thus the possibility of a contact in between the exposed portion and the casing of equipment or the like is reduced and therefore the short-circuiting therebetween can be suppressed.

(Item 2) An element mounting board according to Item 1, wherein the length of the exposed portion, where the partial surface thereof in the lateral face is exposed, in a thickness direction of the metallic substrate is smaller than the thickness of the metallic substrate of the lateral face.

By employing Item 2, the exposed portion where the partial surface of the metallic material is exposed is made smaller. Thereby, the possibility of short-circuiting at the exposed portion of the metallic material can be further reduced and eventually the breakdown strength can be enhanced.

(Item 3) An element mounting board according to Item 1 or Item 2, wherein an oxide formed at corners of the metallic substrate is formed such that the thickness of the oxide at the corners thereof is larger than that at regions other than the corners.

By employing Item 3, when a high voltage is applied, the occurrence of electric field concentrated on the corners of the metallic substrate is suppressed and consequently the occurrence of short-circuiting between the corners and the casing of equipment or the like can be suppressed.

(Item 4) An element mounting board according to any one of Item 1 to Item 3, wherein a protrusion formed integrally with the metallic substrate is provided in the lateral face, and
the exposed portion of the lateral face where the partial surface of metallic material is exposed is formed on a top surface of the protrusion parallel with the lateral face.

By employing Item 4, the exposed portion where the partial surface of the metallic material is exposed is made smaller. Thereby, the possibility of short-circuiting at the exposed portion of the metallic material can be further reduced and consequently the breakdown strength can be enhanced.

(Item 5) An element mounting board according to any one of Item 1 to Item 3, wherein a recess is provided, towards inside of the metallic substrate, on the lateral face of the metallic substrate, and
the exposed portion of the lateral face where the partial surface of metallic material is exposed is formed by a bottom of the recess and two faces connecting the bottom thereof and the lateral face.

By employing Item 5, the exposed surface of the metallic material is located inside the oxide film. Thereby, the possibility of short-circuiting at the exposed portion of the metallic material can be further reduced and consequently the breakdown strength can be enhanced.

(Item 6) An element mounting board according to any one of Item 1 to Item 3, wherein a recess is provided towards inside of the metallic substrate, on the lateral face of the metallic substrate,
a protrusion, which protrudes from a bottom of the recess and which is formed integrally with the metallic substrate is provided, a height of the protrusion being smaller than a depth of the recess, and the exposed portion of the lateral face where the partial surface of metallic material is exposed is formed on a top surface of the protrusion parallel with the lateral face.

By employing Item 6, the exposed portion of the metallic material is located more inwardly than the lateral face of the metallic substrate. Thus, Item 6 can enhance the effect of preventing the short-circuiting between a circuit in a semiconductor module and the casing of equipment or the like when a high voltage is applied at the startup of the semiconductor module.

(Item 7) An element mounting board according to Item 4, wherein the protrusion is formed such the length of the protrusion in a thickness direction of the metallic substrate is smaller than the thickness of the metallic substrate.

By employing Item 7, the exposed portion of the metallic material is made smaller. Thereby, the possibility of short-circuiting at the exposed portion of the metallic material can be further reduced and consequently the breakdown strength can be enhanced.

(Item 8) A semiconductor module, wherein a semiconductor element is provided in the pattern of the element mounting board according to any one of Item 1 to Item 7.

By employing Item 8, the voltage breakdown characteristics of the semiconductor module can be enhanced.

(Item 9) A method for fabricating a semiconductor module, the method including:
preparing a substrate having a first slit, a second slit, a first tie bar, and a second tie bar, wherein mounting regions in which a semiconductor element and/or a passive element are/is mounted are arranged in matrix,
the first slit is provided between mutually adjacent the mounting regions arranged in a matrix,
the second slit is provided on a periphery of the mounting regions arranged in a matrix,
the first tie bar is provided between a lateral face of a mounting region and a lateral face of a mounting region adjacent to said mounting region,
the second tie bar is provided between a lateral face of a mounting region and a frame adjacent to said lateral face thereof;
generating an insulating layer on a surface of the substrate, a reverse side thereof, and lateral faces between the surface thereof and the reverse side thereof, the insulating layer being generated from metallic material whose main material is the substrate;
mounting the semiconductor element and/or the passive element to the mounting region so as to be electrically connected; and
cutting the first tie bar and the second tie bar so as to separate the substrate into individual pieces.

By employing Item 9, a semiconductor module with an improved breakdown strength can be manufactured.

(Item 10) A method, of fabricating a semiconductor module, according to Item 9, wherein a protrusion formed integrally with the metallic substrate is provided in the lateral face, and the metallic material is exposed on a top surface of the protrusion, in a manner such that the first tie bar or the second tie bar is cut and the mounting regions are separated.

(Item 11) A method, of fabricating a semiconductor module, according to Item 9, wherein the protrusion is formed such that the thickness of the protrusion is smaller than that of the metallic substrate.

By employing Item 11, the exposed portion where the partial surface of the metallic material is exposed is made smaller. Thereby, the possibility of short-circuiting at the exposed portion of the metallic material can be further reduced and consequently the breakdown strength can be enhanced.

(Item 12) A method, of fabricating a semiconductor module, according to Item 9, wherein a recess is provided, towards inside of the metallic substrate, on the lateral face of the metallic substrate, and the recess is formed by a bottom of the recess and two faces connecting the bottom thereof and the lateral face,
wherein each of the first tie bar and the second tie bar is formed integrally with the bottom thereof, and
wherein a protrusion formed integrally with the metallic substrate is provided in the bottom, and the metallic material is exposed on a top surface of the protrusion, in a manner such that the first tie bar or the second tie bar is cut and the mounting regions are separated.

By employing Item 12, the exposed surface of the metallic material is located inside the oxide film. Thereby, the possibility of short-circuiting at the exposed portion of the metallic material can be further reduced and consequently the breakdown strength can be enhanced.

(Item 13) An element mounting board including:
a metallic substrate;
an oxide film formed such that surfaces of the metallic substrate are oxidized;
an insulating resin layer provided on the oxide film that faces one main surface of the metallic substrate; and
a wiring layer provided on the insulating resin layer,
wherein the oxide film has a thick film portion in at least part of peripheral regions in the oxide film facing the one main surface of the metallic substrate, the thick film portion being such that the thickness of the thick film portion in the at least part of peripheral regions is greater than that of the other parts of the oxide film formed in the surface of the metallic substrate.

By employing Item 13, the insulation properties between the metallic portion and the peripheral regions of the metallic substrate in the element mounting substrate can be enhanced.

(Item 14) An element mounting board according to Item 13, wherein the wiring layer is provided near a peripheral region of the metallic substrate.

By employing Item 14, the insulation properties between the wiring layer and the peripheral regions of the metallic substrate in the element mounting substrate can be enhanced.

(Item 15) An element mounting board according to Item 13 or Item 14, wherein the metallic substrate has a protrusion, which protrudes in a direction perpendicular to the one main surface thereof, in at least part of a peripheral region on a side of the one main surface thereof, and
wherein the thick film portion covers the protrusion.

Even though the electric field is concentrated on the protrusion, Item 14 can reduce the possibility of dielectric breakdown occurring between the protrusion and the wiring layer and its consequent short-circuiting therebetween.

(Item 16) An element mounting board according to Item 15, wherein the protrusion is a burr formed when the metallic substrate is formed by a process of separating a metallic sheet into individual pieces.

Even though the electric field is concentrated on the burr when the bur is formed by the process of separating the metallic sheet into individual pieces, Item 16 can reduce the possibility of dielectric breakdown occurring between the protrusion and the wiring layer and its consequent short-circuiting therebetween.

(Item 17) A semiconductor module including:
an element mounting board according to any one of Item 13 to Item 17; and a semiconductor element electrically connected to the wiring layer, the semiconductor element being mounted on a main surface of the element mounting board on a side where the wiring layer is formed.

By employing Item 17, the semiconductor element is mounted on the element mounting board the reliability of which has been improved, so that the reliability of the semiconductor module can be improved.

(Item 18) A method for fabricating an element mounting board, the method including:

forming a metallic substrate by a process of separating a metallic sheet into individual pieces;

roughing a surface of a protrusion formed, in at least part of a peripheral region of the metallic substrate, by the process of separating the metallic sheet into individual pieces;

forming an oxide film on a surface of the metallic substrate by performing an oxidation treatment;

stacking an insulating resin layer on the oxide film provided on a main surface of the metallic substrate at a downstream side of a punching direction in the process of separating the metallic sheet into individual pieces; and forming a wiring layer in a manner such that a metal layer is stacked on the insulating resin layer and then the metal layer is selectively removed.

By employing Item 18, the element mounting board the reliability of which has been improved can be manufactured.

(Item 19) A method, of fabricating an element mounting board, according to Item 18, wherein the oxidation treatment is an anodic oxidation treatment.

Item 19 can manufacture the highly reliable element mounting board having the metallic substrate on the surface of which the oxide film has been formed by the anodic oxidation treatment.

What is claimed is:

1. An element mounting board including:
a metallic substrate formed of metallic material;
an insulating layer provided on the metallic substrate; and
a pattern formed of a metal provided on the insulating layer,
wherein oxide films generated from the metallic material are provided in a surface of the metallic substrate, a reverse side disposed counter to the surface of the metallic surface, a surrounding lateral face connecting the surface of the metallic substrate and the reverse side thereof, and
the lateral face, on which the oxide film has generated, has an exposed portion where a partial surface of the metallic material is exposed.

2. An element mounting board according to claim 1, wherein the length of the exposed portion, where the partial surface thereof in the lateral face is exposed, in a thickness direction of the metallic substrate is smaller than the thickness of the metallic substrate of the lateral face.

3. An element mounting board according to claim 1, wherein an oxide formed at corners of the metallic substrate is formed such that the thickness of the oxide at the corners thereof is larger than that at regions other than the corners.

4. An element mounting board according to claim 1, wherein a protrusion formed integrally with the metallic substrate is provided in the lateral face, and the exposed portion of the lateral face where the partial surface of metallic material is exposed is formed on a top surface of the protrusion parallel with the lateral face.

5. An element mounting board according to claim 1, wherein a recess is provided, towards inside of the metallic substrate, on the lateral face of the metallic substrate, and
the exposed portion of the lateral face where the partial surface of metallic material is exposed is formed by a bottom of the recess and two faces connecting the bottom thereof and the lateral face.

6. An element mounting board according to claim 1, wherein a recess is provided towards inside of the metallic substrate, on the lateral face of the metallic substrate,
a protrusion, which protrudes from a bottom of the recess and which is formed integrally with the metallic substrate is provided, a height of the protrusion being smaller than a depth of the recess, and
the exposed portion of the lateral face where the partial surface of metallic material is exposed is formed on a top surface of the protrusion parallel with the lateral face.

7. A semiconductor module, wherein a semiconductor element is provided in the pattern of the element mounting board according to claim 1.

8. An element mounting board according to claim 4, wherein the protrusion is formed such the length of the protrusion in a thickness direction of the metallic substrate is smaller than the thickness of the metallic substrate.

9. An element mounting board comprising:
a metallic substrate;
an oxide film formed such that surfaces of the metallic substrate are oxidized;
an insulating resin layer provided on the oxide film that faces one main surface of the metallic substrate; and
a wiring layer provided on the insulating resin layer,
wherein the oxide film has a thick film portion in at least part of peripheral regions in the oxide film facing the one main surface of the metallic substrate, the thick film portion being such that the thickness of the thick film portion in the at least part of peripheral regions is greater than that of the other parts of the oxide film formed in the surface of the metallic substrate.

10. An element mounting board according to claim 9, wherein the wiring layer is provided near a peripheral region of the metallic substrate.

11. An element mounting board according to claim 9, wherein the metallic substrate has a protrusion, which protrudes in a direction perpendicular to the one main surface thereof, in at least part of a peripheral region on a side of the one main surface thereof, and
wherein the thick film portion covers the protrusion.

12. A semiconductor module comprising:
an element mounting board according to claim 9; and
a semiconductor element electrically connected to the wiring layer, the semiconductor element being mounted on a main surface of the element mounting board on a side where the wiring layer is formed.

13. An element mounting board according to claim 11, wherein the protrusion is a burr formed when the metallic substrate is formed by a process of separating a metallic sheet into individual pieces.

* * * * *